(12) United States Patent
Fu et al.

(10) Patent No.: US 7,851,857 B2
(45) Date of Patent: Dec. 14, 2010

(54) DUAL CURRENT PATH LDMOSFET WITH GRADED PBL FOR ULTRA HIGH VOLTAGE SMART POWER APPLICATIONS

(75) Inventors: Yue Fu, Chandler, AZ (US); Ronghua Zhu, Chandler, AZ (US); Vishnu K. Khemka, Phoenix, AZ (US); Amitava Bose, Tempe, AZ (US); Todd C. Roggenbauer, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 12/182,398

(22) Filed: Jul. 30, 2008

(65) Prior Publication Data

US 2010/0025756 A1    Feb. 4, 2010

(51) Int. Cl.
H01L 29/78 (2006.01)
H01L 29/76 (2006.01)
H01L 21/336 (2006.01)

(52) U.S. Cl. .......... 257/343; 257/328; 257/335; 257/337; 257/339; 257/342; 257/409; 257/492; 257/493; 257/E29.256; 257/E21.417

(58) Field of Classification Search ......... 257/288, 257/343, 339, 342, 328, 335, 337, 409, 492, 257/493, E29.256, E21.417
See application file for complete search history.

(56) References Cited

U.S. PATENT DOCUMENTS

| | | | |
|---|---|---|---|
| 4,811,075 A * | 3/1989 | Eklund | 257/369 |
| 6,023,090 A * | 2/2000 | Letavic et al. | 257/347 |
| 6,168,983 B1 | 1/2001 | Rumennik et al. | |
| 6,441,432 B1 * | 8/2002 | Sumida | 257/339 |
| 6,747,332 B2 | 6/2004 | de Fresart et al. | |
| 6,894,349 B2 * | 5/2005 | Beasom | 257/343 |
| 6,909,143 B2 | 6/2005 | Jeon et al. | |
| 2001/0038122 A1 * | 11/2001 | Matsuzaki et al. | 257/339 |
| 2003/0178646 A1 * | 9/2003 | Disney | 257/200 |

(Continued)

OTHER PUBLICATIONS

J. Olsson et al., 1 W/mm Rf Power Density at 3.2 GHz for a Dual-Layer RESURF LDMOS Transistor, IEEE Electron Device Letters, vol. 23, No. 4, Apr. 2002.

(Continued)

Primary Examiner—Fernando L Toledo
Assistant Examiner—John P Dulka
(74) Attorney, Agent, or Firm—Hamilton & Terrile, LLP; Michael Rocco Cannatti

(57) ABSTRACT

A dual current path LDMOSFET transistor (40) is provided which includes a substrate (400), a graded buried layer (401), an epitaxial drift region (404) in which a drain region (416) is formed, a first well region (406) in which a source region (412) is formed, a gate electrode (420) formed adjacent to the source region (412) to define a first channel region (107), and a current routing structure that includes a buried RESURF layer (408) in ohmic contact with a second well region (414) formed in a predetermined upper region of the epitaxial layer (404) so as to be completely covered by the gate electrode (420), the current routing structure being spaced apart from the first well region (406) and from the drain region (416) on at least a side of the drain region to delineate separate current paths from the source region and through the epitaxial layer.

20 Claims, 3 Drawing Sheets

U.S. PATENT DOCUMENTS

| | | | |
|---|---|---|---|
| 2004/0178443 A1* | 9/2004 | Hossain et al. | 257/328 |
| 2006/0001102 A1* | 1/2006 | Pendharkar | 257/368 |
| 2008/0113498 A1 | 5/2008 | Khemka et al. | |
| 2010/0096694 A1* | 4/2010 | Goarin | 257/331 |

OTHER PUBLICATIONS

J. Cai et al., A Novel High Performance Stacked LDD RF LDMOSFET, IEEE Electron Device Letters, vol. 22, No. 5, May 2001.

S. Nuttinck et al., Comparison Between Si-LDMOS and GaN-Based Microwave Power Transistors, IEEE Lester Eastman Conference on High Performance Devices, Aug. 6-8, 2002.

A. Soderbarg et al., Integration of a Novel High-Voltage Giga-Hertz DMOS Transistor into a Standard CMOS Process, International Electron Devices Meeting, Dec. 10-13, 1995.

* cited by examiner

DUAL CURRENT PATH LDMOSFET WITH GRADED PBL FOR ULTRA HIGH VOLTAGE SMART POWER APPLICATIONS

BACKGROUND OF THE INVENTION

1. Field of the Invention

The present invention is directed in general to high-voltage integrated circuits and methods for manufacturing same. In one aspect, the present invention relates to the manufacture and use of lateral double diffusion MOS transistor (LDMOS-FET) devices employing reduced surface field (RESURF) structures.

2. Description of the Related Art

High-voltage integrated circuits applications, such as high-voltage smart power applications, are constructed with integrated circuit MOS field effect transistor devices which must be able to sustain high voltages (e.g., fifty volts or greater) across the transistor device's source, body, gate, and drain terminals. With such high-voltage applications, lateral double diffusion MOS (LDMOS) transistor devices are often used to provide the high-voltage transistor devices. However, such LDMOS devices usually require thick and low doped epitaxial layer, which makes them difficult to integrate with low-voltage circuitry on the same chip. Another challenge presented with LDMOS devices is that there are typically tradeoffs between the on-resistance and breakdown voltage parameters of such devices, where the on-resistance is ideally kept low and the breakdown voltage is ideally kept high. For example, a design for an LDMOS device which increases the device breakdown voltage typically also increase the on-resistance, which is undesirable. Rapid progress in process technology has made logic devices significantly smaller for each generation. In high voltage devices, however, the required silicon distance to support needed breakdown voltage does not change. As a result, process technology advances have not significantly reduced the size of high voltage devices which must maintain a minimum breakdown voltage. Innovative device design is the only solution to reduce the die size for high voltage device. Those skilled in the art will understand that the reduced surface field (RESURF) structures can be used to redistribute the field density inside the LDMOS device, thereby maintaining the same breakdown voltage while achieving a low on-resistance with increased doping concentration of the epitaxial layer.

Accordingly, a need exists for improved semiconductor devices, especially RESURF type semiconductor devices having improved breakdown voltage, without a corresponding degradation of other important device properties. There is also a need for a high-voltage transistor device and fabrication processes to overcome the problems in the art, such as outlined above. Further limitations and disadvantages of conventional processes and technologies will become apparent to one of skill in the art after reviewing the remainder of the present application with reference to the drawings and detailed description which follow.

BRIEF DESCRIPTION OF THE DRAWINGS

The present invention may be understood, and its numerous objects, features and advantages obtained, when the following detailed description is considered in conjunction with the following drawings, in which.

Figure 1:
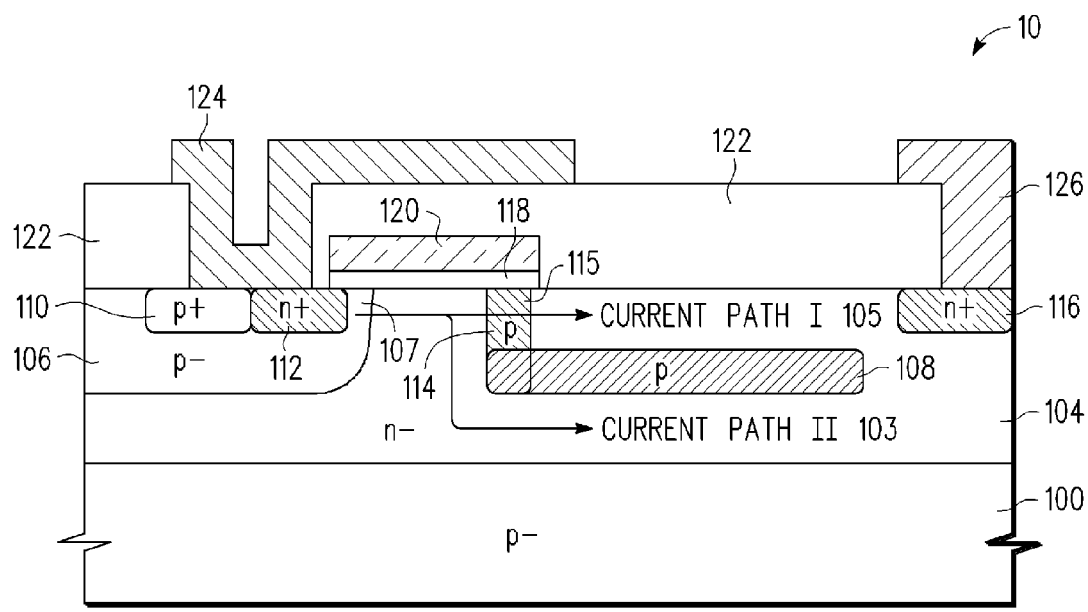
FIG. 1 is a partial cross-sectional view of a multi-RESURF transistor structure for use with high side operations in accordance with selected embodiments of the present invention.

It will be appreciated that for simplicity and clarity of illustration, elements illustrated in the drawings have not necessarily been drawn to scale. For example, the dimensions of some of the elements are exaggerated relative to other elements for purposes of promoting and improving clarity and understanding. Further, where considered appropriate, reference numerals have been repeated among the drawings to represent corresponding or analogous elements.

DETAILED DESCRIPTION

A lateral diffused MOS (LDMOS) transistor with one or more RESURF layers that provide multiple current paths under control of a single gate electrode is described for use with high voltage (e.g., approximately 600 V) smart power applications. The disclosed LDMOS transistor is formed on a semiconductor substrate of a first conductivity type (e.g., a p-type substrate) on which a first semiconductor region of a second conductivity type (e.g., an n-type epitaxial layer) is formed that will define a drift region for the LDMOS transistor for current flow from a source region to a drain region under control of a gate electrode. Within a first high voltage well region of the first conductivity type formed in an upper portion of the epitaxial layer (e.g., P-body), a source region of the second conductivity type (e.g., N+ source region) is formed. In addition, a drain region of the second conductivity type (e.g., N+ drain region) is formed in an upper portion of the epitaxial layer so that the drain region is spaced a predetermined distance from the source region. To delineate separate current paths through the epitaxial layer, an "L" shaped current routing structure of the first conductivity type may be formed in the epitaxial layer. The current routing structure includes a second well region of the first conductivity type (e.g., p-well) formed in the epitaxial layer below the gate electrode and spaced apart from the first high voltage well region. The current routing structure also includes one or more buried RESURF layers of the first conductivity type (e.g., P-RESURF layers) formed in the epitaxial layer to extend from the second well region laterally toward the drain region, though not extending so far as be located under the drain region. Current from the source region enters the drift region under control of a gate electrode formed over and insulated from the epitaxial layer, where the gate electrode is positioned adjacent to the source region so as to completely cover the second well region without extending substantially over the one or more buried RESURF layers. With the disclosed arrangement, the second well region, source region, adjacent gate electrode (and underlying second well region) and the current routing structure may be arrayed or wrapped around the sides and termination end of a drain region so that multiple current paths from the source region are created as the current flows around the current routing structure and to the drain region. As the second well region wraps around the termination end of the drain region, the second well region may merge into electrical contact with the first high voltage well region (P-body), or may be instead be formed as a floating second well region that is electrically isolated from the P-body. For low side applications, the LDMOS transistor includes a buried layer having graded doping is provided under the drift region to further improve device performance and ensure sufficient voltage for low side applications. For high side applications, the buried layer with graded doping is not included so as to ensure sufficient voltage for high side operation.

Various illustrative embodiments of the present invention will now be described in detail with reference to the accompanying figures. While various details are set forth in the following description, it will be appreciated that the present invention may be practiced without these specific details, and that numerous implementation-specific decisions may be made to the invention described herein to achieve the device designer's specific goals, such as compliance with process technology or design-related constraints, which will vary from one implementation to another. While such a development effort might be complex and time-consuming, it would nevertheless be a routine undertaking for those of ordinary skill in the art having the benefit of this disclosure. For example, selected aspects are depicted with reference to simplified cross sectional drawings of a semiconductor device without including every device feature or geometry in order to avoid limiting or obscuring the present invention. Such descriptions and representations are used by those skilled in the art to describe and convey the substance of their work to others skilled in the art. In addition, although specific example materials are described herein, those skilled in the art will recognize that other materials with similar properties can be substituted without loss of function. It is also noted that, throughout this detailed description, certain materials will be formed and removed to fabricate the semiconductor structure. Where the specific procedures for forming or removing such materials are not detailed below, conventional techniques to one skilled in the art for growing, depositing, removing or otherwise forming such layers at appropriate thicknesses shall be intended. Such details are well known and not considered necessary to teach one skilled in the art of how to make or use the present invention.

FIG. 1 is a partial cross-sectional view of a multi-RESURF transistor structure 10 having two current paths for use with high side operations in accordance with selected embodiments of the present invention. The transistor 10 is formed on or as part of a semiconductor substrate 100 formed of a material having first conductivity type impurities, such as a p-type substrate. For example, the semiconductor substrate 100 may be formed with p-type material having a doping level of approximately $5E13$ $cm^{-3}$, though other dopant types and/or concentrations may be used. Depending on the type of transistor device being fabricated, the semiconductor substrate 100 may be formed from any semiconductor material, including, for example, Si, SiC, SiGe, SiGeC, Ge, GaAs, InAs, InP as well as other III/V or II/VI compound semiconductors or any combination thereof. Although bulk type of substrate is shown here for the description of the invention, the invention is not limited to any specific substrate type. For example, the starting substrate 100 for the invention can be of semiconductor-on-insulator (SOI) type having a buried insulator layer under a top layer of semiconductor.

On the semiconductor substrate 100, a first semiconductor region 104 is formed that will define a drift region for the transistor structure 10. In selected embodiments, the first semiconductor region 104 may be formed with an epitaxial layer of a material having second conductivity type impurities, such as by epitaxially growing an n-type epitaxial layer 104 that is doped during epitaxial growth with predetermined dosage of n-type impurities. For example, the epitaxial layer 104 may be formed with n-type material having a total integrated doping of approximately $3E12$ $cm^{-2}$, or an epitaxial layer 104 having a thickness in the range of approximately 30-50 um with an n-type doping concentration of approximately $5E14$ to $5E15$ $cm^{-3}$, though other dopant types and/or concentrations may be used. In these embodiments, the epitaxial layer 104 provides an n-type drift space for the transistor structure 10.

In the epitaxial layer 104, a first high voltage well region 106 (a.k.a., P-body region) is formed to a predetermined depth of a material having the first conductivity type (e.g., p-type) impurities so as to be located in an upper portion of the epitaxial layer 104 where the source region is ultimately to be formed. For example, the first high voltage well region 106 may be formed by using an implant mask to selectively diffuse or implant p-type impurities to a predetermined implant energy and dopant concentration (e.g., $1E16$ to $1E17$ $cm^{-3}$).

The epitaxial layer 104 also includes source and drain regions. For example, a first source region 112 is formed of a material having second conductivity type impurities (e.g., N++ source region) in a predetermined upper region of the first high voltage well region 106. In addition, a first source contact region 110 is formed of a material having second conductivity type impurities (e.g., P++ body contact region) so as to be adjacent to the first source region 112 in the first high voltage well region 106. The source contact region 110 is the "back gate" or "body" region that is shorted to the first source region 112 to improve device robustness. Finally, a first drain region 116 is formed of a material having second conductivity type impurities (e.g., N++ drain region) in a predetermined upper region of the epitaxial layer 104 so as to be located a predetermined distance away from the source region 112. Though the source and drain regions 110, 112, 116 can be formed using photoresist implant masks to selectively diffuse or implant the appropriate impurities into the epitaxial layer 104, it will be appreciated that other masking techniques may also be used.

A current routing structure is also formed in the epitaxial layer 104 using materials having the first conductivity type (e.g., p-type) impurities, such as by forming a second well region 114 and one or more buried RESURF layers 108 in ohmic contact with one another but spaced apart from the first high voltage well region 106. The second well region 114 may be formed by using an implant mask to selectively diffuse or implant p-type impurities into the epitaxial layer 104 to a predetermined implant energy and dopant concentration (e.g., $1E16$ to $1E17$ $cm^{-3}$) so as to be located in an upper portion of the epitaxial layer 104 below the gate electrode and spaced apart from the first high voltage well region. As for each buried RESURF layer 108, a different mask and implant sequence is used to selectively implant p-type impurities into the epitaxial layer 104 to a predetermined implant energy and dopant concentration (e.g., $5E13$ to $5E15$ $cm^{-3}$) so as to overlap with the second well region 114 and extend from the second well region 114 laterally toward the drain region 116, though not extending so far as be located under the drain region 116. Thus, the buried RESURF layer 108 may be formed from a p-type material having a heavier doping than the underlying p-type substrate 100 that is located entirely under the upper n-type drift region 105 and overlapping it partially. As depicted, the buried RESURF layer(s) 108 may extend into the epitaxial layer 104 by a predetermined distance to define a lower drift region 103 and an upper drift region 105. While the particular length of the extension is not critical, the buried RESURF layer(s) 108 should be in ohmic contact with the upper and lower portions of the epitaxial layer 104 that are relatively remote from drain region 116 and be ohmically coupled to the second well region 114 and spaced apart from the high voltage well region 106. The current routing structure 114, 118 is formed as an "L" shaped current routing structure to delineate separate current paths through the epitaxial layer when a single buried RESURF layer 108 is formed. However, it will be appreciated that "F" and "E" shaped current routing structures can be formed when additional buried RESURF layers 108 are formed.

Over the epitaxial layer 104, a gate electrode structure is formed by sequentially forming a gate insulating layer 118 and a gate electrode layer 120, and then patterning and etching the layers 118, 120 to form the gate electrode structure 118, 120. As formed, the gate electrode structure 118, 120 is positioned to be adjacent to the source region 112, to cover part of the first high voltage well region 106, and to completely cover the second well region 114 without extending substantially over the one or more buried RESURF layers 108. Finally, the transistor structure 10 includes a source electrode 124 and drain electrode 126 that are isolated from one another by one or more dielectric or insulator layers 122, where the source and drain electrodes 124, 126 are formed to make ohmic contact with the source and drain regions 110, 112, 116. The breakdown voltage $V_{BD}$ of transistor structure 10 is measured between terminals 124 and 126.

In this configuration, the gate electrode structure 118, 120 defines, in effect, two channel regions. The first channel region 107 is arranged in an upper portion of the first high voltage well region 106 below the gate electrode structure 118, 120, that is, between the first source region 112 and the epitaxial layer 104. The second channel region 115 is arranged in an upper portion of the second well region 114 below the gate electrode structure 118, 120, and in effect provides an inversion channel region.

With this configuration, the gate electrode structure 118, 120 controls how current from the source region enters the drift region by creating multiple current paths from a single source region, including a first current path (indicated by arrow "I") and a second current path (indicated by arrow "II"). The first current path I is a path into which electrons flow from the source region 112, through the first channel region 107 and the second channel region 115, and into the upper drift region along the upper portion 105 of the epitaxial layer 104 located above the buried RESURF layer 108. The second current path II is a path into which electrons flow from the source region 112, through the first channel region 107 and into the lower drift region along the lower portion 103 of the epitaxial layer 104 located below the buried RESURF layer 108. Since only a single source region 112 is required to generate the two current paths I, II, the size of the transistor structure 10 is reduced as compared to other structures which use multiple source regions to generate multiple current paths. The two current paths increase the current transport ability, and thereby reduce the on-resistance for the transistor structure 10. However, the breakdown voltage is not also reduced because the buried RESURF layer 108 acts as field shaping layer that maintain the breakdown voltage parameter. For example, a breakdown voltage of 737V and an on-resistance of 12.0 ohm-mm$^2$ may be obtained by forming a transistor structure 10 with a p-type substrate 100 doped to approximately 5E13 cm$^{-3}$, an n-type epitaxial layer 104 formed with a total integrated doping of approximately 3E12 cm$^{-2}$, and a cell pitch of 80 µm. As will be appreciated, when the current routing structure includes additional buried RESURF layers formed separately below the first buried RESURF layer 108 and connected to the second well region 114, additional current paths may be provided to further reduce the on-resistance and maintain the breakdown voltage.

Figure 2:
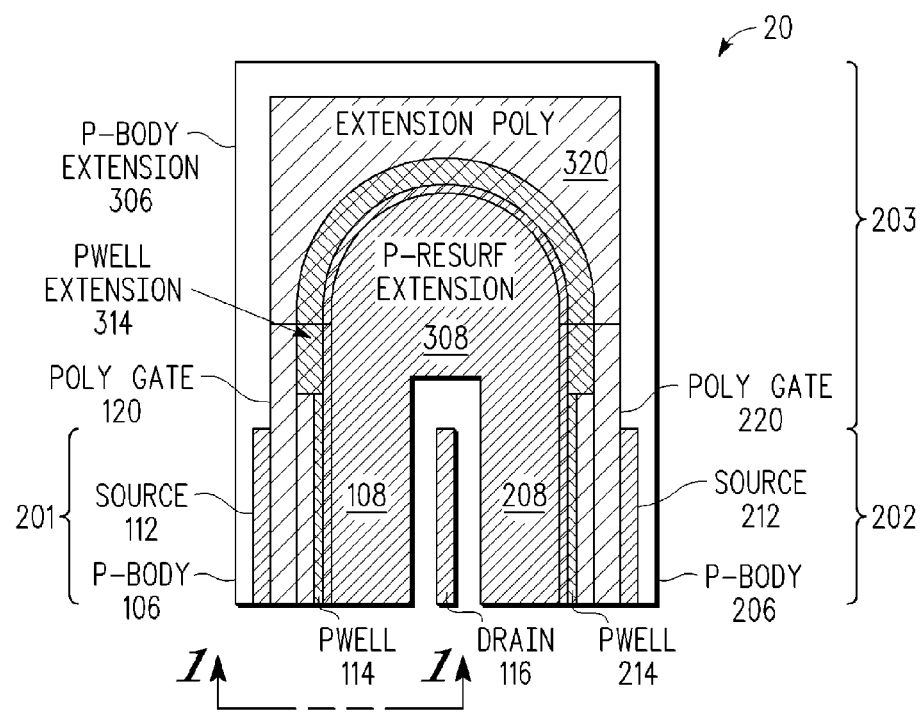
FIG. 2 is a plan view of the multi-RESURF transistor device which is formed using the transistor structure shown in FIG. 1 in accordance with selected embodiments where the p-well is merged with the P-body region.

With the transistor structure 10 shown in FIG. 1, a single gate electrode 118, 120, single source region 112, and current routing structure 114, 108 may be efficiently positioned on one side of the drain region 116 to create two current paths I, II, thereby providing a high voltage LDMOS transistor that requires a small chip area. This efficient layout and positioning may be exploited to form a similar transistor structure on the other side of the drain region 116. For example, FIG. 2 depicts a plan view of a multi-RESURF transistor device 20 which is formed using two of the transistor structures shown in FIG. 1 on each side of a drain region in accordance with selected embodiments where the second well region 114 is merged with the first high voltage well region 106 (a.k.a., P-body region) around the termination end of the drain region 116. As depicted, the transistor device 20 includes a first transistor component 201 arrayed on the left side of the drain region 116, a second transistor component 202 arrayed on the right side of the drain region 116, and a connection or wrap-around component 203 arrayed about the termination end of a drain region 116.

As indicated by the perspective arrows labeled "FIG. 1," the first transistor component 201 corresponds structurally to the multi-RESURF transistor structure 10 depicted in FIG. 1. From the plan view of FIG. 2, the first transistor component 201 includes at least a source region 112 contained within the first high voltage well region 106 (a.k.a., P-body region) of the epitaxial layer. (For simplicity, the epitaxial layer and first source contact region are not shown in FIG. 2.) In addition, the first transistor component 201 includes a current routing structure formed in the epitaxial layer with the buried RESURF layer 108 (a.k.a., P-RESURF) and second well region 114 (a.k.a., p-well) which are in direct electrical contact with one another, but are spaced apart from the source region 112 and P-body region 106. The first transistor component 201 also includes a centrally located drain region 116 formed in the epitaxial layer which is spaced apart from the source region 112 and the current routing structure 108, 114. Finally, the first transistor component 201 includes a polysilicon gate electrode layer 120 formed over the epitaxial layer which controls the flow of current from the source region 112 via the current routing structure 114, 108 and across the drift region toward the drain region 116.

The second transistor component 202 is structurally identical to the first transistor component 201, but mirrored on the opposite side of the drain region 116. Thus, the second transistor component 202 includes at least a source region 212 contained within the high voltage well or P-body region 206; a current routing structure formed with the buried P-RESURF layer 208 and p-well region 214 which are in direct electrical contact with one another, but are spaced apart from the source region 212; a centrally located shared drain region 116 which is spaced apart from the source region 212 and the current routing structure 208, 214; and a polysilicon gate electrode layer 220 which controls the flow of current from the source region 212 via the current routing structure 214, 208 and across the drift region toward the drain region 116. According to a plan view of FIG. 2, the source regions 112, 212 are separated from one another. However, in actuality, the source regions 112, 212 are electrically connected to one another, such as by way of a metal or other conductive layer that contacts both source regions 112, 212.

To electrically connect the first transistor component 201 to the second transistor component 202, a connection or wrap-around component 203 is arrayed about the termination end of a drain region 116. The depicted wrap-around component 203 includes a high voltage well extension region 306 (a.k.a., P-body region), the second well extension region 314, the buried RESURF extension layer 308, and the polysilicon extension gate layer 320 that wrap around at least one termination end of a drain region 116. As depicted in FIG. 2, the p-well extension region 314 and the P-body extension region 306 in the wrap-around component 203 are overlapped or merged together so that they are in direct electrical contact with one another. As will be appreciated, the merging of these regions may be accomplished with any of a number of techniques, such widening the extensions of the second (p-well) well region 314 in the wrap-around component 203 so as to overlap or contact the P-body extension region 306. By merging the current routing extension structures 308, 314 with the P-body extension region 306 at the termination end of a drain region 116, these regions share the same electrical potential, and thereby reduce the breakdown voltage for the transistor device while keeping the second p-well regions 114, 214 at the same potential as the buried RESURF layers 108, 208 for better prediction on device switching characteristics.

Figure 3:
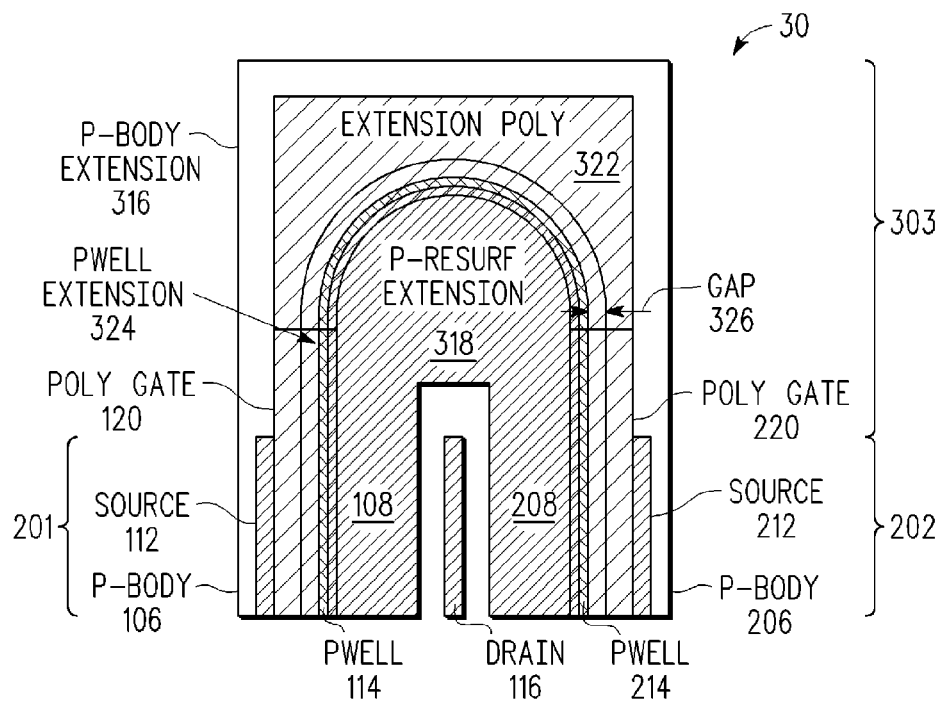
FIG. 3 is a plan view of the multi-RESURF transistor device which is formed using the transistor structure shown in FIG. 1 in accordance with selected embodiments where the p-well is floating.

The efficient layout and positioning of the transistor structure 10 may also be exploited to form mirrored LDMOS transistor structures with floating p-well regions. For example, FIG. 3 depicts a plan view of the multi-RESURF transistor device 30 which is formed using two of the transistor structures shown in FIG. 1 on each side of a drain region in accordance with selected embodiments where the second well extension region 114 is floating around the termination end of the drain region 116. As depicted, the transistor device 30 includes a first transistor component 201 arrayed on the left side of the drain region 116, a second transistor component 202 arrayed on the right side of the drain region 116, and a connection or wrap-around component 303 arrayed about the termination end of a drain region 116. While the first transistor component 201 and second transistor component 202 are described above with reference to FIG. 2, the connection or wrap-around component 303 depicted in FIG. 3 is constructed to include a floating p-well extension region 324. In particular, the depicted wrap-around component 303 includes a high voltage well extension region 316 (a.k.a., P-body region), a second well extension region 324 that is spaced apart from the P-body extension region 316 (as indicated by the gap 326), a buried RESURF extension layer 318 in electrical contact with the second well extension region 324, and the polysilicon extension gate layer 322 that wrap around at least one termination end of a drain region 116. As depicted in FIG. 3, the p-well extension region 324 and the P-body extension region 316 in the wrap-around component 203 are spaced apart from one another by a gap 326. In selected embodiments, the spacing may be achieved by patterning the implant masks for the p-well extension region 324 and the P-body extension region 316 so that a gap 326 is formed between the respective implant regions. By forming the p-well extension region 324 so that it is a floating region, a higher breakdown voltage may be obtained for the transistor device 30.

Figure 4:
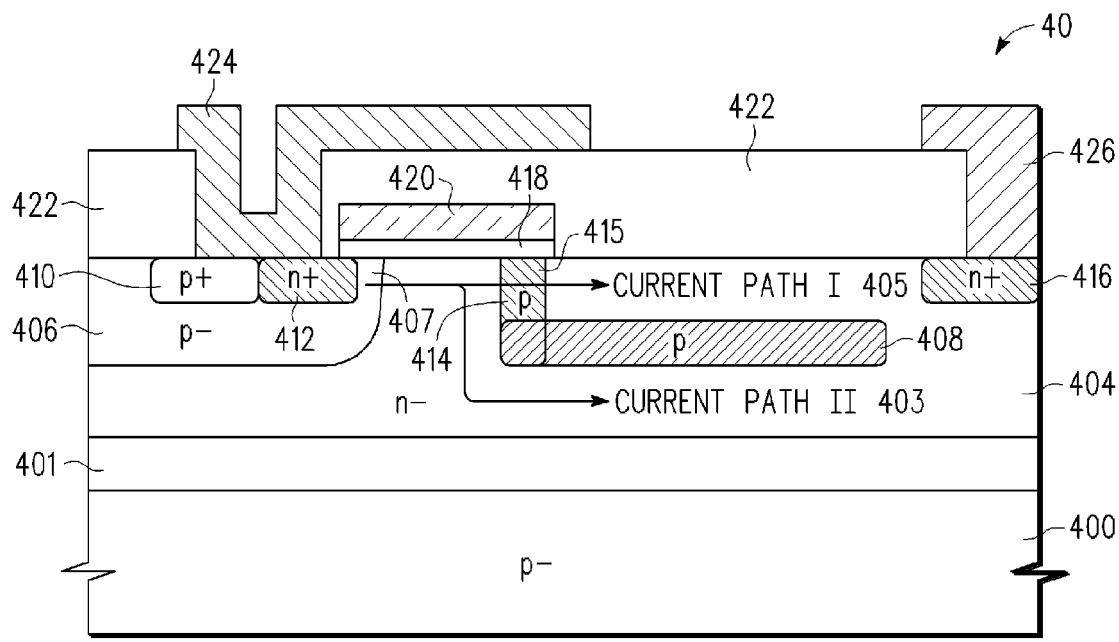
FIG. 4 is a partial cross-sectional view of a multi-RESURF transistor device having a graded buried layer for use with low side operations in accordance with selected embodiments of the present invention.

As described hereinabove, transistor structures formed with one or more buried RESURF layers allow multiple current paths to be formed from a single source region, thereby reducing the transistor's on-resistance while maintaining the breakdown voltage. However, selected embodiments of the present invention provide a way to increase the breakdown voltage while reducing the on-resistance by including a buried layer between the epitaxial layer and the semiconductor substrate. To provide an example implementation, reference is now made to FIG. 4 which depicts a partial cross-sectional view of a multi-RESURF transistor device 40 having a graded buried layer 401 for use with low side operations in accordance with selected embodiments of the present invention. The depicted transistor device 40 is formed on or as part of a semiconductor substrate 400 formed of a material having first conductivity type impurities, such as a p-type substrate with bulk or SOI type semiconductor material, such as, for example, Si, SiC, SiGe, SiGeC, Ge, GaAs, InAs, InP as well as other III/V or II/VI compound semiconductors or any combination thereof.

On the semiconductor substrate 400, a graded buried layer 401 is formed to a predetermined depth with a material having the first conductivity type (e.g., p-type) impurities. As formed, the graded buried layer 401 is located between the semiconductor substrate 400 and the subsequently formed epitaxial layer 404. In addition, the concentration of the impurities in the buried layer 401 is controlled during formation to provide a varied doping concentration such that the doping concentration is heavier below the area where the source region 412 is ultimately to be formed, and is graded gradually to a lighter doping concentration below the area where the drain region 416 is ultimately to be formed. For example, the left edge of the graded buried layer 401 ohmically communicates with the (subsequently formed) high voltage well region 406, is aligned below the source region 412, and has a dopant concentration C of about C=Co at that edge where C falls off with increasing distance to the right toward the N++ drain region 416. Alternatively, where the doping concentration C is constant in the graded buried layer 401, then the thickness of the graded buried layer 401 may vary, dropping off as x increases. Alternatively, the photo mask used to implant the graded buried layer may have different opening size and spacing so that the amount of impurities changes along the x-axis to the desired value. However formed, the graded buried layer 401 may implant p-type impurities to a predetermined implant energy and dopant concentration.

On the graded buried layer 401, an epitaxial layer 404 is formed with a material having second conductivity type impurities that will define a drift region for the transistor device 40, such as by epitaxially growing a doped n-type epitaxial layer 104. In the epitaxial layer 404, a first high voltage well region 406 (a.k.a., P-body region) is formed to a predetermined depth of a material having the first conductivity type (e.g., p-type) impurities so as to be located in an upper portion of the epitaxial layer 404 where the source region is ultimately to be formed. The epitaxial layer 404 also includes a first source region 412 (e.g., N+ source region) and an adjacent first source contact region 410 (e.g., P+ source region) in the first high voltage well region 406. In addition, the epitaxial layer 404 includes a first drain region 416 (e.g., N+ drain region) that is located a predetermined distance away from the source region 412. Though the source and drain regions 410, 412, 416 can be formed using photoresist implant masks or other masking elements (e.g., gate electrode 418, 420) to selectively diffuse or implant the appropriate impurities into the epitaxial layer 404. Finally, the transistor device 40 includes an etched gate electrode 418, 420, as well as a source electrode 124 and drain electrode 126 that are isolated from one another by one or more dielectric or insulator layers 422, where the source and drain electrodes 424, 426 are formed to be electrically connected to the source and drain regions 410, 412, 416.

As will be appreciated, the operation of the transistor device 40 is quite similar to the operation of the transistor device 10 depicted in FIG. 1, in that the transistor device 40 uses the gate electrode structure 418, 420 to controls how current from the source region 412 enters the drift region 404 by using a current routing structure 408, 414 to create multiple current paths from a single source region. However, by including a graded buried layer 401 under the epitaxial layer/drift region 404 with a heavier impurity concentration under the source region 412, the breakdown voltage is raised, thereby increasing the performance of the transistor device 40. For example, a breakdown voltage of 738V and an on-resistance of 10.5 ohm-mm$^2$ may be obtained by forming a transistor structure 10 with a p-type substrate 100 doped to approximately 5E13 cm$^{-3}$, an n-type epitaxial layer 104 with a total integrated doping of approximately 3E12 cm$^{-2}$, a graded buried p-type layer 401 having a graded doping from approximately 8E14 cm$^{-3}$ under the source, and a cell pitch of 80 μm. This results from the fact that the lighter doping of impurities in the graded buried layer 401 below the drain region 416 creates a higher breakdown voltage, while the heavier doping of impurities in the graded buried layer 401 below the source region 412 improves the RESURF action by lowering the electric field at the lateral junction between the first high voltage well region 406 and the epitaxial layer 404.

As will be appreciated, low side operations do not have a large voltage difference between the substrate 400 and the first well region 406, so the presence of the graded buried layer 401 (which narrows the epitaxial layer) does not cause punch through to occur. However, with high side operations where there is a large voltage difference between the substrate 100 and the first well region 406, a graded buried layer would narrow the epitaxial layer and cause punch through to occur. As a result, the graded buried layer may be selectively formed to be included only for transistor structures being used for low side applications.

Figure 5:
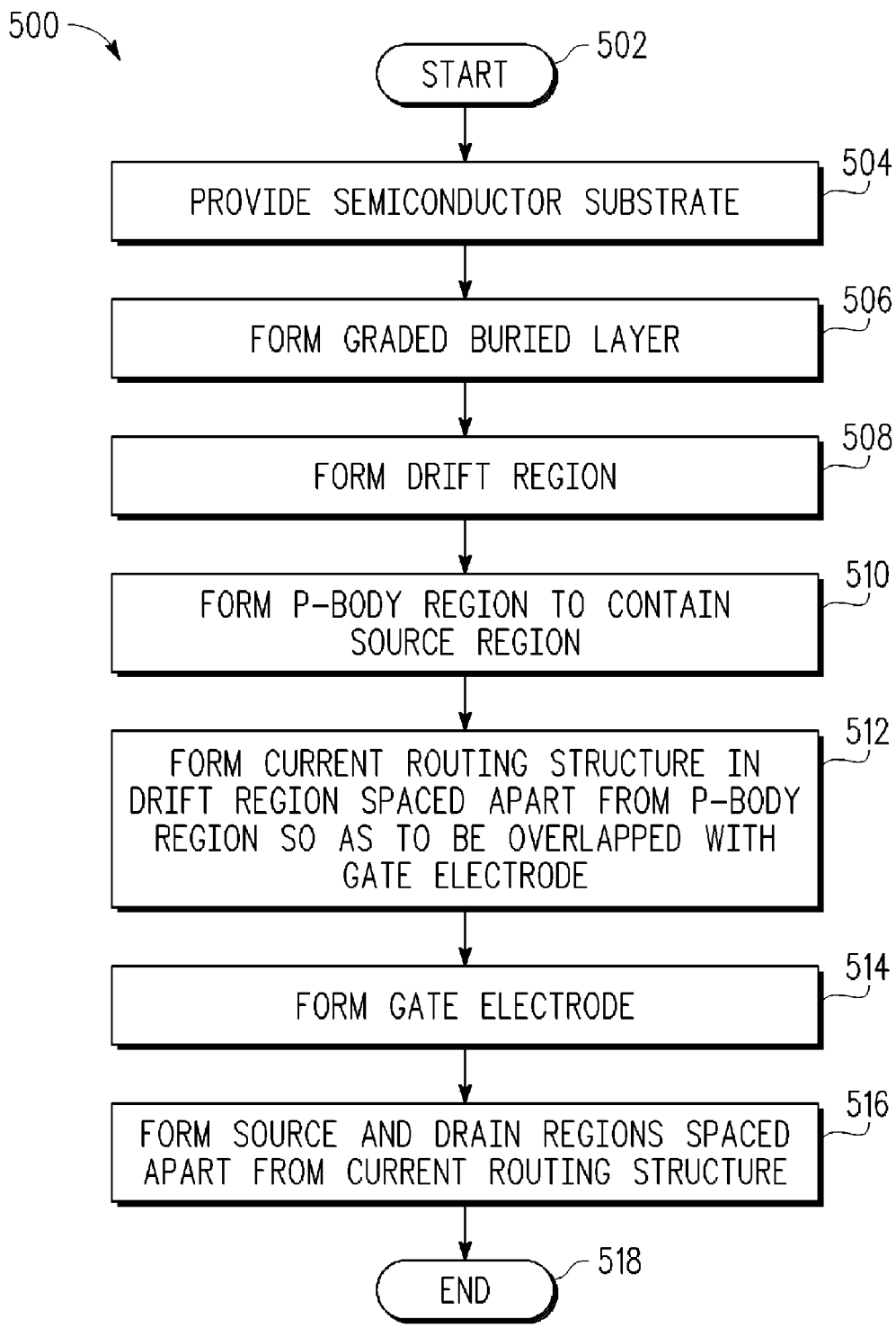
FIG. 5 is a simplified schematic flow chart illustrating a method for fabricating devices in accordance with selected embodiments of the invention.

FIG. 5 is a simplified schematic flow chart illustrating a method 500 for fabricating devices of the type illustrated in FIGS. 1-4 in accordance with selected embodiments of the invention. In describing the fabrication methodology 500, various reference numbers, doping types and concentrations are provided by way of examples of different regions that can be formed, but this is intended merely to facilitate understanding of various exemplary embodiments and not by way of limitation. Once the fabrication methodology starts (step 502), a semiconductor substrate layer is provided having a first conductivity type (e.g., p-type) and doping concentration (e.g., approximately 5E13 cm$^{-3}$). Unless otherwise indicated, subsequent steps 506, 508, 510, 512, 514 may be provided in any desired order. On or in the semiconductor substrate layer, a graded buried layer may be formed (step 506), at least for transistors to be used with low side applications. As formed, the graded buried layer has the first conductivity type (e.g., p-type) and a doping concentration and/or thickness that varies from an initial dopant concentration (e.g., approximately 8E14 cm$^{-3}$) in the source region area that falls off with increasing distance toward the drain region. In addition, a drift region is formed over the semiconductor layer (and over the graded buried layer if present) (step 508), such as by epitaxially growing a material having a second conductivity type (e.g., n-type) at a predetermined total integrated doping (e.g., approximately 3E12 cm$^{-2}$). At step 510, a P-body region having the first conductivity type (e.g., p-type) at a predetermined doping concentration (e.g., approximately 5E13 cm$^{-3}$) is formed in or adjacent to the drift region (e.g., by implantation) so as to completely contain the subsequently formed source region. In addition, a current routing structure is formed in the drift region (step 512) so as to be spaced apart from the P-body region and overlapped with the subsequently formed gate electrode. The current routing structure may be formed by implanting a well region having the first conductivity type (e.g., p-type) at a predetermined doping concentration (e.g., approximately 5E13 cm$^{-3}$) so as to be located below the subsequently formed gate electrode, and then implanting one or more buried semiconductor regions of the first conductivity type (e.g., p-type) at a predetermined dose (e.g., approximately 1E12 to 5E12 cm$^{-2}$) in the drift region so as to be in ohmic contact with the well region and have a first lateral extent that is substantially parallel to the surface of the semiconductor substrate. After forming a gate dielectric layer, a control or gate electrode may be formed (step 514) to overlie part of the P-body region and to extend to the well region of the current routing structure. At step 516, source and drain regions are formed proximate to the upper surface of the drift region, such as by implanting impurities of a second conductivity type (e.g., N-type) at a predetermined doping concentration (e.g., N++), where the source region is located to be completely contained within the P-body region, and the drain region is located to be spaced apart from the current routing structure and P-body region. In addition, a source contact region may be formed adjacent to the source region with a material of the first conductivity type (e.g., P-type) at a predetermined doping concentration (e.g., P++). As depicted, the fabrication methodology 500 ends at step 518.

By now it should be appreciated that there is provided herein a lateral double diffusion MOS transistor device and method for fabricating same. The disclosed transistor device is formed over a semiconductor substrate formed with a material having first conductivity type impurities (e.g., p-type), and includes a first semiconductor region formed over the semiconductor substrate (e.g., by epitaxial growth) with a material having second conductivity type impurities (e.g., n-type). A graded buried layer of a material having first conductivity type impurities may be formed between the semiconductor substrate and the first semiconductor region, where the graded buried layer has a decreasing concentration of impurities of the first conductivity type as a function of distance from the source region to the drain region. For example, the average doping concentration of a portion of the graded buried layer underlying the source region is greater than an average doping concentration of a portion of the graded buried layer that is closer to the drain region. In addition, a first well region of a material having first conductivity type impurities is formed adjacent to the first semiconductor region, and in a predetermined upper region of the first well region, a first source region of a material having second conductivity type impurities is formed. In a predetermined upper region of the first semiconductor region, a drain region of a material having second conductivity type impurities is formed so as to be spaced a predetermined distance from the first well region. By forming a gate electrode and a gate insulating layer over part of the first well region and substantially adjacent to the source region, a first channel region is defined inside the first well region. Finally, a current routing structure of material having first conductivity type impurities is formed in the first semiconductor region. In selected embodiments, the current routing structure includes one or more buried RESURF layers in ohmic contact with a second well region formed in a predetermined upper region of the first semiconductor region so as to be completely covered by the same gate electrode so that the current routing structure is spaced apart from the first well region and from the drain region on at least a side of the drain region to delineate separate current paths from the source region and through the first semiconductor region. The buried RESURF layer(s) may be formed in the first semiconductor region to define an upper drift region and a lower drift region, and to extend out from below the gate electrode and toward the drain region. As for the second well region, it may be formed of a material having only first conductivity type impurities formed in the first semiconductor region to overlap with the one or more buried RESURF layers. In selected embodiments, the first well region overlaps or makes ohmic contact with the current routing structure at a termination end of the drain region, while in other embodiments, the first well region floats because it is spaced apart from the current routing structure at a termination end of the drain region.

In another form, there is provided a method for forming a semiconductor device. In the disclosed methodology, a first semiconductor substrate region is provided having a first conductivity type (e.g., p-type), and an epitaxial layer of a second opposite conductivity type (e.g., n-type) is formed on the first semiconductor substrate region. Thereafter, in any desired order, a first well region of the first conductivity type is formed adjacent to the epitaxial layer. In addition, a first source region of the second conductivity type is formed in a predetermined upper region of the first well region. In addition, a drain region of the second conductivity type is formed in a predetermined upper region of the epitaxial layer, the drain region being spaced a predetermined distance from the first well region. In addition, a current routing structure is formed in the epitaxial layer with one or more semiconductor regions of the first conductivity type, where the current routing structure includes a buried RESURF layer in ohmic contact with a second well region formed in a predetermined upper region of the epitaxial layer. In selected embodiments, the current routing structure may be formed by selectively implanting one or more buried RESURF layers of the first conductivity type in the epitaxial layer having a first overall lateral extent that is substantially parallel to an upper surface of the epitaxial layer and that is less than the predetermined distance between the drain region and the first well region, and then selectively implanting the second well region of the first conductivity type so as to be ohmically coupled to the one or more buried RESURF layers and completely covered by the gate electrode. As formed, the current routing structure is spaced apart from the first well region and from the drain region on at least a side of the drain region to delineate separate current paths from the source region and through the epitaxial layer. Finally, a gate electrode is formed over at least part of the first well region and substantially adjacent to the source region so as to be completely cover the second well region, thereby defining a first channel region inside the first well region. As formed, the first well region may be formed so as to be spaced apart from the second well region on at least a side of the drain region and to be ohmically coupled with the second well region at a termination end of the drain region. Alternatively, the first well region may be formed so as to be spaced apart from the second well region on at least a side of the drain region and to be spaced apart from the second well region at a termination end of the drain region. In addition, a graded buried layer of the first conductivity type may be formed between the first semiconductor substrate region and the epitaxial layer, where the graded buried layer has a decreasing concentration of impurities of the first conductivity type as a function of distance from the source region to the drain region. In selected embodiments, the graded buried layer is formed by patterning an implant mask over the epitaxial layer to have larger openings near the source region and smaller openings near the drain region, and then implanting impurities into the epitaxial layer to form the graded buried layer using the patterned implant mask as a mask for ion implantation.

In yet another form, a lateral double-diffused MOS (LDMOS) transistor and method for fabricating same is provided. As disclosed, the LDMOS transistor includes a p-type semiconductor substrate and an n-type drift region formed on the p-type semiconductor substrate. In addition, an n-type drain region is formed in a predetermined upper region of the n-type drift region. In addition, the LDMOS transistor includes a first p-type well region formed adjacent to the n-type drift region and spaced apart from the p-type semiconductor substrate, where the first p-type well region is arrayed around both sides and a termination end of the first n-type drain region so as to be spaced apart from the first n-type drain region. In addition, a first n-type source region is formed in a predetermined upper region of the first p-type well region, where the first n-type source region is arrayed on both sides of the first n-type drain region so as to be spaced apart from the first n-type drain region. By forming a gate insulating layer and gate electrode substantially adjacent to the first n-type source region so as to be located over at least part of the first p-type well region and the n-type drift region and arrayed around both sides and a termination end of the first n-type drain region so as to be spaced apart from the first n-type drain region, a first channel region is defined inside the first p-type well region. The LDMOS transistor also includes a second p-type well region formed in the n-type drift region so as to be completely covered by the gate electrode, where the second p-type well region is arrayed around both sides and a termination end of the first n-type drain region so as to be spaced apart from the first n-type drain region. Finally, the LDMOS transistor includes a first p-type buried layer formed in the n-type drift region to contact the first buried p-type layer in the n-type drift region below the gate electrode, where the first p-type buried layer has a first overall lateral extent that is arrayed around both sides and a termination end of the first n-type drain region so as to be spaced apart from the first n-type drain region. As formed, the first p-type well region may overlap with the second p-type well region at the termination end of the first n-type drain region, or may instead be spaced apart from the second p-type well region at the termination end of the first n-type drain region. With either structure, the first p-type buried layer and the second p-type well region create separate current paths from the first n-type source region through the n-type epitaxial layer to the first n-type drain region. In selected embodiments, a graded p-type buried layer may be formed between the p-type semiconductor substrate and the n-type drift region, where the graded p-type buried layer has a varied doping concentration of p-type impurities which decreases as a function of distance from the first n-type source region to the first n-type drain region.

Although the described exemplary embodiments disclosed herein are directed to various multi-RESURF LDMOS transistors and methods for making same, the present invention is not necessarily limited to the example embodiments which illustrate inventive aspects of the present invention that are applicable to a wide variety of LDMOS transistor fabrication processes and/or structures. Thus, the particular embodiments disclosed above are illustrative only and should not be taken as limitations upon the present invention, as the invention may be modified and practiced in different but equivalent manners apparent to those skilled in the art having the benefit of the teachings herein. For example, while the various devices illustrated herein are for N-channel LDMOS transistor devices or the like, this is merely for convenience of explanation and not intended to be limiting and persons of skill in the art will understand that the principles taught herein apply to devices of either conductivity type. Accordingly, the identification of particular regions as N-type or P-type is merely by way of illustration and not limitation and opposite conductivity type regions may be substituted in order to form devices of opposite conduction type. Moreover, the thickness of the described layers may deviate from the disclosed thickness values. Accordingly, the foregoing description is not intended to limit the invention to the particular form set forth, but on the contrary, is intended to cover such alternatives, modifications and equivalents as may be included within the spirit and scope of the invention as defined by the appended claims so that those skilled in the art should understand that they can make various changes, substitutions and alterations without departing from the spirit and scope of the invention in its broadest form.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A lateral double diffusion MOS transistor device, comprising:
    a semiconductor substrate formed of a material having first conductivity type impurities;
    a first semiconductor region of a material having second conductivity type impurities formed over the semiconductor substrate;
    a first well region of a material having first conductivity type impurities formed adjacent to the first semiconductor region;
    a first source region of a material having second conductivity type impurities formed in a predetermined upper region of the first well region;
    a drain region of a material having second conductivity type impurities formed in a predetermined upper region of the first semiconductor region, the drain region being spaced a predetermined distance from the first well region;
    a gate electrode formed over a gate insulating layer and substantially adjacent to the source region, thereby defining a first channel region inside the first well region; and
    a current routing structure of material having first conductivity type impurities formed in the first semiconductor region, comprising a buried RESURF layer in ohmic contact with a second well region formed in a predetermined upper region of the first semiconductor region, where the second well region is completely covered by the gate electrode and where the current routing structure is spaced apart from the first well region and from the drain region on at least a side of the drain region to delineate separate current paths from the source region and through the first semiconductor region.

2. The device of claim 1, further comprising a graded buried layer of a material having first conductivity type impurities formed between the semiconductor substrate and the first semiconductor region.

3. The device of claim 2, wherein the graded buried layer has a decreasing concentration of impurities of the first conductivity type as a function of distance from the source region to the drain region.

4. The device of claim 2, wherein an average doping concentration of a portion of the graded buried layer underlying the source region is greater than an average doping concentration of a portion of the graded buried layer that is closer to the drain region.

5. The device of claim 1, where the first conductivity type impurities comprise p-type impurities, and the second conductivity type impurities comprise n-type impurities.

6. The device of claim 1, where the current routing structure comprises:
    one or more buried RESURF layers of a material having first conductivity type impurities formed in the first semiconductor region to define an upper drift region and a lower drift region, the one or more buried RESURF layers extending out from below the gate electrode and toward the drain region; and
    the second well region of a material having only first conductivity type impurities formed in the first semiconductor region to overlap with the one or more buried RESURF layers.

7. The device of claim 1, where the first well region overlaps or makes ohmic contact with the current routing structure at a termination end of the drain region.

8. The device of claim 1, where the first well region is spaced apart from the current routing structure at a termination end of the drain region.

9. A method for forming a semiconductor device, comprising:
    providing a first semiconductor substrate region of a first conductivity type;
    forming an epitaxial layer of a second opposite conductivity type on the first semiconductor substrate region; and then in any order;
    forming a first well region of the first conductivity type adjacent to the epitaxial layer;
    forming a first source region of the second conductivity type in a predetermined upper region of the first well region;
    forming a drain region of the second conductivity type in a predetermined upper region of the epitaxial layer, the drain region being spaced a predetermined distance from the first well region;
    forming a current routing structure in the epitaxial layer with one or more semiconductor regions of the first conductivity type, comprising a buried RESURF layer in ohmic contact with a second well region formed in a predetermined upper region of the epitaxial layer, the current routing structure being spaced apart from the first well region and from the drain region on at least a side of the drain region to delineate separate current paths from the source region and through the epitaxial layer; and
    forming a gate electrode over at least part of the first well region and substantially adjacent to the source region so as to completely cover the second well region, thereby defining a first channel region inside the first well region.

10. The method of claim 9, further comprising forming a graded buried layer of the first conductivity type between the first semiconductor substrate region and the epitaxial layer, where the graded buried layer has a decreasing concentration of impurities of the first conductivity type as a function of distance from the source region to the drain region.

11. The method of claim 10, where forming the graded buried layer comprises:
   forming a patterned implant mask over the epitaxial layer that is patterned to have larger openings near the source region and smaller openings near the drain region; and
   implanting impurities into the epitaxial layer to form the graded buried layer using the patterned implant mask as a mask for ion implantation.

12. The method of claim 9, where the first conductivity type is p-type, and the second conductivity type is n-type.

13. The method of claim 9, where forming the current routing structure in the epitaxial layer comprises selectively implanting one or more buried RESURF layers of the first conductivity type in the epitaxial layer having a first overall lateral extent that is substantially parallel to an upper surface of the epitaxial layer and that is less than the predetermined distance between the drain region and the first well region.

14. The method of claim 9, where forming the current routing structure in the epitaxial layer comprises selectively implanting the second well region of the first conductivity type so as to be ohmically coupled to the one or more buried RESURF layers, where the second well region is completely covered by the gate electrode.

15. The method of claim 9, where forming the first well region comprises forming the first well region so as to be spaced apart from the second well region on at least a side of the drain region and to be ohmically coupled with the second well region at a termination end of the drain region.

16. The method of claim 9, where forming the first well region comprises forming the first well region so as to be spaced apart from the second well region on at least a side of the drain region and to be spaced apart from the second well region at a termination end of the drain region.

17. A lateral double-diffused MOS (LDMOS) transistor comprising:
   a p-type semiconductor substrate;
   an n-type drift region formed on the p-type semiconductor substrate;
   an n-type drain region formed in a predetermined upper region of the n-type drift region;
   a first p-type well region formed adjacent to the n-type drift region and spaced apart from the p-type semiconductor substrate, the first p-type well region being arrayed around both sides and a termination end of the first n-type drain region so as to be spaced apart from the first n-type drain region;
   a first n-type source region formed in a predetermined upper region of the first p-type well region, the first n-type source region being arrayed on both sides of the first n-type drain region so as to be spaced apart from the first n-type drain region;
   a gate insulating layer and gate electrode formed substantially adjacent to the first n-type source region so as to be located over at least part of the first p-type well region and the n-type drift region, thereby defining a first channel region inside the first p-type well region, the gate insulating layer and gate electrode being arrayed around both sides and a termination end of the first n-type drain region so as to be spaced apart from the first n-type drain region;
   a second p-type well region formed in the n-type drift region so as to be completely covered by the gate electrode, the second p-type well region being arrayed around both sides and a termination end of the first n-type drain region so as to be spaced apart from the first n-type drain region; and
   a first p-type buried layer formed in the n-type drift region to contact the second p-type well region in the n-type drift region below the gate electrode, said first p-type buried layer having a first overall lateral extent that is arrayed around both sides and a termination end of the first n-type drain region so as to be spaced apart from the first n-type drain region;
   where the first p-type buried layer and the second p-type well region create separate current paths from the first n-type source region through the n-type epitaxial layer to the first n-type drain region.

18. The LDMOS transistor of claim 17, where the first p-type well region overlaps with the second p-type well region at the termination end of the first n-type drain region.

19. The LDMOS transistor of claim 17, where the first p-type well region is spaced apart from the second p-type well region at the termination end of the first n-type drain region.

20. The LDMOS transistor of claim 17, further comprising a graded p-type buried layer formed between the a p-type semiconductor substrate and the n-type drift region, where the graded p-type buried layer has a varied doping concentration of p-type impurities which decreases as a function of distance from the first n-type source region to the first n-type drain region.

* * * * *